(12) United States Patent
Ma

(10) Patent No.: US 11,538,932 B2
(45) Date of Patent: Dec. 27, 2022

(54) SEMICONDUCTOR TRANSISTOR DEVICE AND METHOD OF MANUFACTURING THE SAME

(71) Applicant: Infineon Technologies Austria AG, Villach (AT)

(72) Inventor: Ling Ma, Redondo Beach, CA (US)

(73) Assignee: Infineon Technologies Austria AG, Villach (AT)

( * ) Notice: Subject to any disclaimer, the term of this patent is extended or adjusted under 35 U.S.C. 154(b) by 92 days.

(21) Appl. No.: 16/849,303

(22) Filed: Apr. 15, 2020

(65) Prior Publication Data

US 2020/0335621 A1 Oct. 22, 2020

(30) Foreign Application Priority Data

Apr. 16, 2019 (EP) .................................... 19169613

(51) Int. Cl.
*H01L 29/78* (2006.01)
*H01L 29/10* (2006.01)
*H01L 29/40* (2006.01)
*H01L 29/66* (2006.01)
*H01L 29/872* (2006.01)

(52) U.S. Cl.
CPC ...... *H01L 29/7806* (2013.01); *H01L 29/1095* (2013.01); *H01L 29/66712* (2013.01); *H01L 29/872* (2013.01)

(58) Field of Classification Search
CPC ............ H01L 29/7806; H01L 29/1095; H01L 29/66712; H01L 29/872; H01L 29/0696; H01L 29/407; H01L 29/66734; H01L 29/7813; H01L 27/0629; H01L 21/8249; H01L 29/1037; H01L 29/66143; H01L 29/66666; H01L 29/7827
See application file for complete search history.

(56) References Cited

U.S. PATENT DOCUMENTS

| 7,816,732 | B2 * | 10/2010 | Hsieh | ................. | H01L 29/7813 257/334 |
| 8,722,434 | B2 * | 5/2014 | Hsieh | ................. | H01L 29/7806 257/334 |
| 8,928,071 | B2 * | 1/2015 | Shirai | ................ | H01L 29/7813 257/341 |
| 2005/0029585 | A1 | 2/2005 | He et al. | | |
| 2012/0061753 | A1 | 3/2012 | Nishiwaki | | |
| 2013/0313576 | A1 | 11/2013 | Nakano | | |
| 2016/0218209 | A1 * | 7/2016 | Mauder | ................ | H01L 29/086 |
| 2017/0309713 | A1 * | 10/2017 | Hirler | ................ | H01L 29/7806 |

* cited by examiner

*Primary Examiner* — Shahed Ahmed
*Assistant Examiner* — Khatib A Rahman
(74) *Attorney, Agent, or Firm* — Murphy, Bilak & Homiller, PLLC

(57) ABSTRACT

The present application relates to a semiconductor transistor device that includes a Schottky diode electrically connected in parallel to a body diode formed between a body region and a drift region. A diode junction of the Schottky diode is formed adjacent to the drift region and is arranged vertically above a lower end of the body region.

14 Claims, 7 Drawing Sheets

SEMICONDUCTOR TRANSISTOR DEVICE AND METHOD OF MANUFACTURING THE SAME

TECHNICAL FIELD

The present disclosure relates to a semiconductor transistor device with a vertical channel formed in a body region.

BACKGROUND

In a vertical field effect transistor, a vertical channel is formed in the body region by a gate region arranged laterally aside to the body region. The channel electrically connects the source and the drain region, wherein a power transistor device comprises a drift region for forming a drift zone vertically between the body region and the drain region. Between the body region and the drift region, a so-called body diode is formed, and a voltage drop across this body diode contributes to the power or switching losses of the device.

SUMMARY

It is an object of the present application to provide a vertical transistor device with improved device characteristics, as well as a method of manufacturing such a device.

This object is achieved by the transistor device of claim 1. Moreover, it is achieved by the method of claim 13. The device comprises a Schottky diode electrically connected in parallel to the body diode. Therein, the diode junction of the Schottky diode is formed adjacent to the drift region, and it is arranged vertically above a lower end of the body region. In an embodiment, the Schottky diode has a lower forward voltage than the body diode, the voltage drop at the Schottky diode can for instance be 0.5 V compared to 0.7 V at the body diode. The reduction of the voltage at a given current, for instance by 0.2 V in this example, allows for a power loss reduction.

Therein, the diode junction of the Schottky diode is not formed below the body region but above a lower end thereof. In particular, it can be formed at an upper surface of the semiconductor substrate, which can for instance be advantageous in terms of the manufacturing. For comparison, a Schottky junction below the body region could for example be formed at a side wall of a field electrode trench, by a metal contact extending in the trench down to the drift region. However, the characteristics of this Schottky junction could depend from two process variables, the trench etch and the body implant, with a respective lot variation. Apart from that, a metal structure below the body region, which would be comparably small, could also be critical and take much current under high reverse current conditions.

In general words, an idea of this application is to provide a semiconductor device, in particular a field effect transistor, with an additional diode having a lower forward voltage than a diode formed between the body and the drift region. The junction of the additional diode, in particular a Schottky diode, is not arranged below the body region but on the same height, or even at an upper end thereof or above.

Preferred embodiments and features are provided in this description and in the dependent claims. Therein, the individual features shall be disclosed independently of a specific claim category, the disclosure relates to apparatus and device aspects, but also to method and use aspects. If for instance a device manufactured in a specific way is described, this is also a disclosure of a respective manufacturing process, and vice versa.

The source region is of a first conductivity type, and the body region is of a second conductivity type opposite to the first conductivity type. The drift region and the drain region both are of the first conductivity type, wherein the dopant concentration is lower in the drift region. For instance, a mean dopant concentration in the drift region may be 1E17 cm$^{-3}$ at maximum, or even only 5E16 cm$^{-3}$ at maximum. Possible lower limits are for instance 1E15 cm$^{-3}$ at minimum, or 5E15 per cm$^{-3}$ at minimum. In the illustrated embodiments, the first conductivity type is n-type and the second conductivity type is p-type.

The gate region comprises a gate electrode and a gate dielectric, in particular gate oxide, for instance silicon oxide. The gate electrode is the electrical conductive part of the gate region, it is capacitively coupled to a channel portion of the body region by the gate dielectric. Applying a gate voltage to the gate electrode triggers the channel formation in the body region. The gate electrode may for instance be made of metal or polycrystalline silicon.

The "vertical" direction lies perpendicular to a surface of a layer of the device, for instance a surface of a silicon substrate and/or a surface of an epitaxial layer (deposited on the substrate) and/or a surface of an interlayer dielectric, on which a frontside metallization is deposited, and/or a surface of the frontside metallization itself. The horizontal/lateral directions lie perpendicular to the vertical direction, the device/chip area is for instance taken laterally/horizontally. "Upper" and "lower" refer to the vertical direction, a vertical trench extends for instance in the vertical direction from an upper surface down into the silicon material.

At the frontside of the device, above the source/drain/channel region, a frontside metallization can be provided, for instance a combined source/body contact. The drain contact can be provided at the backside of the device. Alternatively, the drain connection can be routed from the bottom of the drift region to the frontside of the device by vertical conduction, for instance via an n$^+$-sinker. In this case, a separate frontside metal contact will be provided. As a power device, the transistor can for instance have a breakdown voltage of at least 10 V, 20 V, 30 V or 40 V, with possible upper limits of for instance not more than 800 V, 600 V, 400 V, 200 V or 100 V.

In an embodiment, the Schottky diode junction is formed at an upper surface of the drift region and extends in a horizontal plane. In particular, the Schottky junction can be formed without etching into the drift region. The junction formation at the horizontal top surface of the drift region can for instance allow for a comparably simple and robust design.

In an embodiment, the Schottky junction has an area of at least 0.01 μm$^2$, further possible lower limits being for instance at least 0.1 μm$^2$, 1 μm$^2$. 5 μm$^2$, or even 10 μm$^2$. Herein, the area of the individual junction is considered, namely the area of one contiguous metal/semiconductor contact. Thus, in case of a device comprising a plurality of Schottky diodes or cells (see below), the areas of these individual Schottky junctions is not summed up for this comparison. A possible upper limit of the area of the individual Schottky junction is for instance 100 μm$^2$ at maximum.

In an embodiment, the Schottky junction is arranged vertically above an upper end of the body region, namely above a lower end of the source region, thus. In particular, the Schottky junction can be arranged on the same vertical height level as an upper end of the source region. The junction can be formed directly at a surface of a drift region layer, in particular an epitaxially grown layer, in which the source and the body region can for example be formed by implantation, see in detail below. The junction formation at the surface, e.g. without etching into this layer, can for instance allow for a simplified and stable processing.

The device can comprise field electrode regions extending vertically into the drift region. A respective field electrode region can for instance be a strip-like structure arranged in an elongated trench, or it can be a needle structure arranged in a respective trench. The field electrode region can comprise a field electrode, namely an electrically conductive part, for instance of metal or polysilicon. Further, it can comprise a field oxide surrounding the field electrode, isolating it from the drift region. The field electrodes can be electrically connected to the source/body regions, e.g. by the same front side metallization. The field electrode regions can allow for a field shaping by applying a voltage at the field electrode. i.e. controlling the location of peak electric fields and preventing avalanche or hot carrier generation. In case of the needle-shaped field electrode regions, with spicular or columnar field plates or electrodes, also the trenches can have a spicular or columnar shape, referred to as needle trenches.

In an embodiment, which shall also be disclosed independently of the vertical position of the Schottky junction, the Schottky junction extends in a first lateral direction over the whole distance between two neighbouring field electrode regions. In the first lateral direction, which lies perpendicular to the vertical direction, the field electrode regions are arranged consecutively. In case of strip-like field electrode regions in elongated trenches, the first lateral direction can lie perpendicular to the strips. In case of needle-like field electrode regions arranged in a grid-like manner, the first lateral direction is one of the vectors which span a cell of the grid. In particular, the first lateral direction can lie perpendicular to a horizontal side edge of the device.

Seen in a vertical top view, the Schottky junction, which extends over the whole distance between two neighbouring field electrode regions, can extend at least from the field oxide of one region to the field oxide of the neighbouring region. In particular, it can extend from the field electrode of one region to the field electrode of the neighbouring region. For instance, a metal layer contacting the field electrodes can also form the Schottky junction laterally in between. Therein, the Schottky junction and the contact areas between the metal layer and the field electrodes can lie on the same vertical height. This vertical height can lie higher than a metal/field electrode contact in an active cell, where the metal extends deeper to contact also the body region (see in detail below).

As mentioned, the field electrode regions can be vertical needles or pins forming a grid seen in a vertical top view. In the grid, the needles are arranged consecutively in the first lateral direction and also in a second lateral direction. The directions can particularly lie perpendicular to each other and to the vertical direction, the cells being rectangles, in particular squares. In comparison to a strip design, the cell size can be smaller for the grid, which can for instance facilitate the implementation of complete diode cells without any switching function.

In an embodiment, the source and body regions are arranged in an active cell of the device, wherein the Schottky junction is arranged in a diode cell. The active cell and the diode cell lie one aside the other in the first lateral direction. In general words, a cell is a minimum-volume unit cell defining a translational symmetry. Two cells of the same type, namely two active cells or two Schottky cells, can be symmetrical with respect to a vertical symmetry plane, in particular a symmetry plane intersecting a gate electrode between two active cells centrally. In other words, the gate electrode can have a symmetrical design between two active cells, wherein at each of the opposite side walls of a respective gate trench a channel portion is formed in a respective body region.

The active cells can be symmetrical at least in the first lateral direction, the gate electrodes having a strip design. With an additional translational symmetry in the second lateral direction, the gate electrodes can form a grid. This can be combined with the needle-shaped field regions, which can respectively be arranged centrally in a respective active cell, by way of example.

In an embodiment, the diode cell, which comprises the Schottky junction, is formed without source and/or body implants. As discussed in detail below, the diode cell can be protected by a mask during the source/body implantation of the active cells. Consequently, no implantations are introduced into the drift region layer in the diode cell.

Comparing the widths of the cells taken in the first lateral direction, the diode cell can have at least a two-fold size of the active cell. Having an enlarged diode cell can for instance allow for a sufficient coverage or size of the Schottky junction, while a minimum distance to the surrounding gate electrode can be kept. Possible upper limits of the diode cell size can for instance be not more than a 5-fold or 3-fold width of the active cell.

In case of active cells arranged in a grid, a second width of the diode cell, taken in the second lateral direction, can for instance be not more than a 4-fold of a width of an active cell in the second lateral direction. In combination with the needle-shaped field electrode regions, this width of the active cell can be equal to a distance taken in the second lateral direction between two neighbouring vertical needles (the distance between the needles is taken as a lateral center-to-center distance). Further possible upper limits of the second width of the diode cell can for instance be not more than a 3- or 2-fold of the active cell width or needle distance. A possible lower limit is at least a 1-fold of the width or distance, the second width can also be equal to the active cell width or needle distance.

In an embodiment, the Schottky junction can have a share of at least 10% at an area of the diode cell, further lower limits being for instance at least 20%, 30% or 40%. A lower limit can allow for an efficient use of the cell area. Upper limits of the junction area's share at the diode cell area can for instance be not more than 90%, 80% or 70%, which can help maintain a distance to the neighbouring gate electrode.

For manufacturing a transistor device disclosed here, the Schottky junction is formed vertically above the lower end of the body region. In general, the Schottky junction is formed as a metal-semiconductor junction. The semiconducting part is the drift region, which is formed with a low doping in comparison to the drain region. The Schottky junction can be formed by depositing a metal layer on a locally exposed surface of the drift region layer. In particular, this metal layer can form the front side metallization contacting the source/body region and/or the field electrodes. Prior to forming the Schottky junction, the body and the source region can be formed, in particular by ion implantation into a drift region layer formed before. The drift region layer can be grown epitaxially and doped in-situ during growth.

Independently of these details, after forming the body/source regions, an interlayer dielectric can be deposited, for instance an oxide, in particular silicon oxide. The interlayer dielectric can for instance have a vertical thickness of at least 0.5 µm or 1 µm (with a possible upper limit of for instance not more than 5 µm). For forming a contact to the source/body region, a source contact hole is etched through the interlayer dielectric, and a diode hole is etched through the interlayer dielectric for forming the Schottky junction.

In an embodiment, the source contact hole and the diode hole are etched subsequently, namely in different process steps. The source contact hole can be etched first and the diode hole thereafter. The source contact hole can for instance be etched deeper than the diode hole, the latter extending for instance only down to an upper surface of the drift region layer, whereas the former can extend further downward into the body region. Etching the holes in different process steps can allow for applying a respectively adapted etch chemistry.

In an embodiment, when the body/source regions are formed by ion implantation, the Schottky cell can be protected by a mask. The mask can in particular cover the whole diode cell, so that no body/source implant is introduced in the diode cell. Prior to depositing the interlayer dielectric discussed above, the mask is removed.

Those skilled in the art will recognize additional features and advantages upon reading the following detailed description, and upon viewing the accompanying drawings.

BRIEF DESCRIPTION OF THE DRAWINGS

Below, the transistor device and the manufacturing of the same are explained in further detail by means of exemplary embodiments. Therein, the individual features can also be relevant for the invention in a different combination.

DETAILED DESCRIPTION

Figure 1:
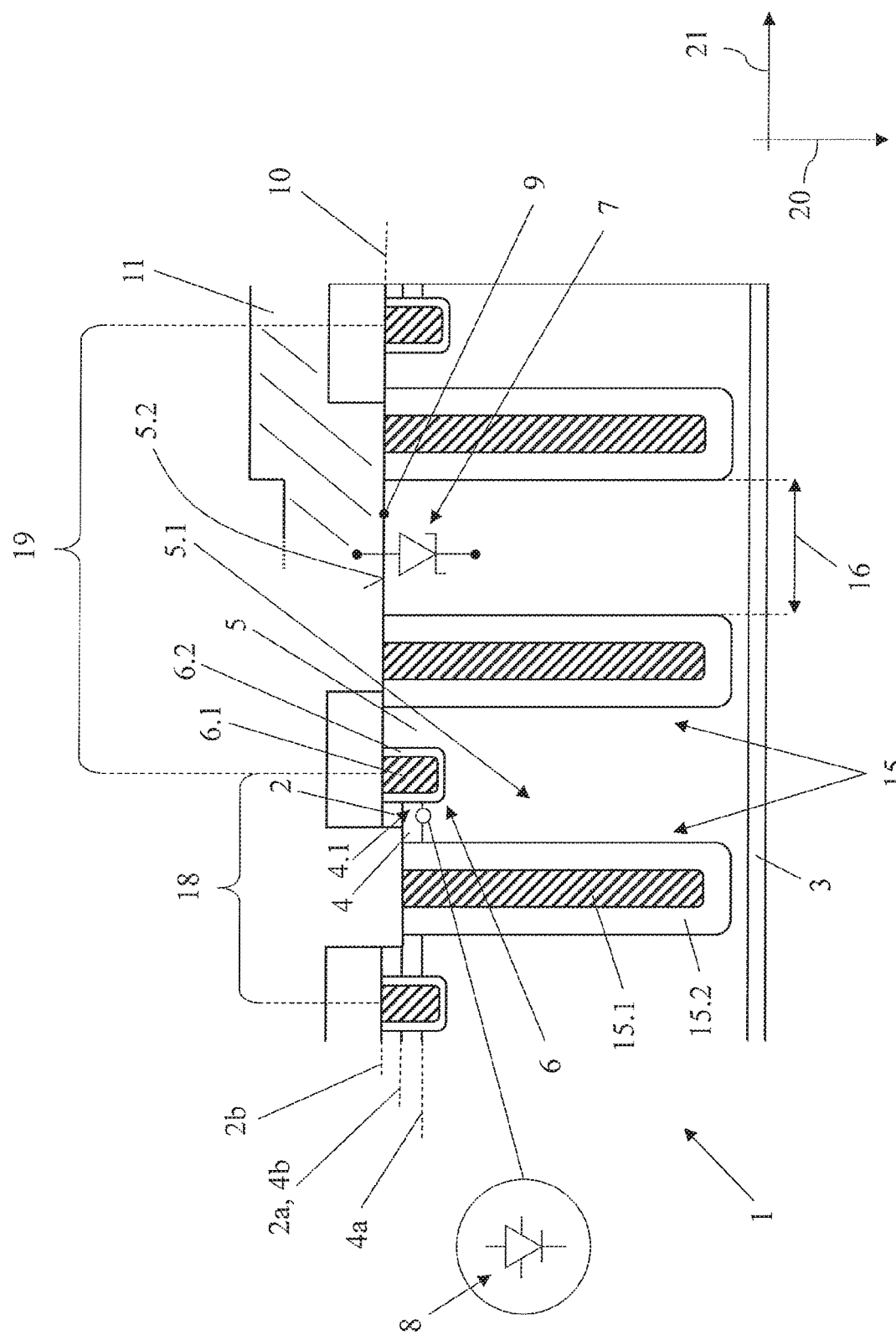
FIG. 1 shows a transistor device with a Schottky diode electrically connected in parallel to a body diode.

FIG. 1 shows a semiconductor transistor device 1 comprising a source region 2, a drain region 3, and a body region 4. Further, it comprises a drift region 5 with a lower doping compared to the drain region 3. Laterally aside the body region 4, a gate region 6 is arranged, having a gate electrode 6.1 and a gate dielectric 6.2. The gate dielectric 6.2, e.g. gate oxide, capacitively couples the gate electrode 6.1 to the body region 4. By applying a voltage to the gate electrode 6.1, a channel 4.1 can be formed in the body region 4.

Between the body region 4 and the drift region 5, a body diode 8 is formed. The power or switching losses of the transistor device 1 can depend from a voltage drop across this body diode 8. To reduce these losses, the device 1 comprises a Schottky diode 7 electrically connected in parallel to the body diode 8. Likewise, the voltage drop at a given current can be reduced.

The diode junction 9 of the Schottky diode 7 is not formed below the body region 4, e.g. at a sidewall of a trench. Instead, referring to a vertical direction 20, it is arranged above a lower end 4a of the body region 4, it is in particular arranged above the upper end 4b of the body region 4/the lower end 2a of the source region 2. In the example shown, it is arranged on the same vertical height as the upper end 2b of the source region 2. As discussed by FIGS. 3a-f in detail, this can for instance allow for a stable manufacturing.

The junction 9 of the Schottky diode 7 is formed between the drift region 5 and a front side metallization 11 which is only shown partly. The front side metallization 11 contacts also the source region 2 and the body region 4, as well as field electrode regions 15. These are respectively formed of an electrically conductive field electrode 15.1 and a field oxide 15.2. The latter isolates the field electrode 15.1 from the drift region 5. The diode junction 9 of the Schottky diode 7 extends over the whole distance 16 between two neighbouring field electrode regions 15.

Figure 2:
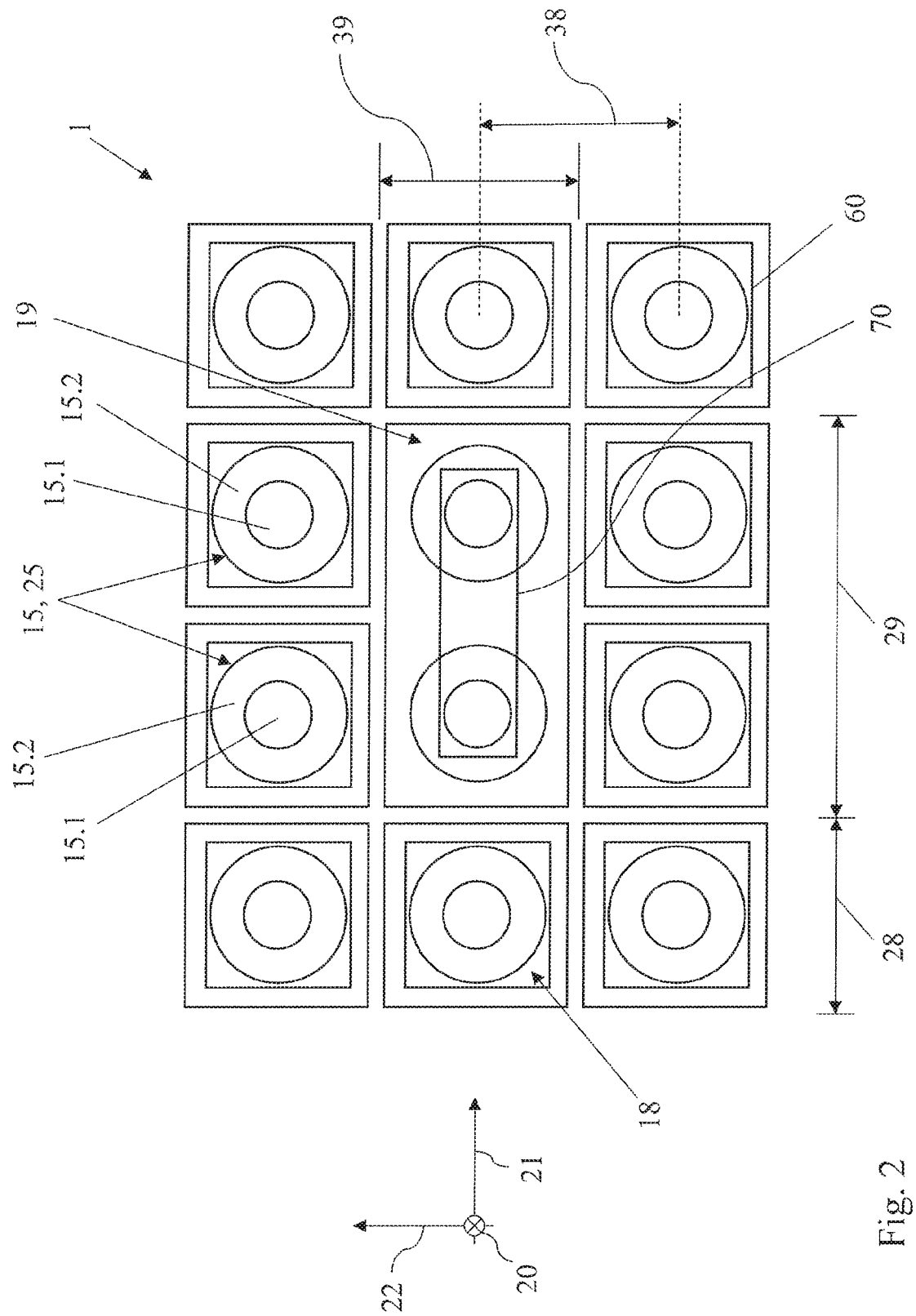
FIG. 2 shows the transistor device of FIG. 1 in a schematical top view.

FIG. 2 shows the transistor device 1 in a schematical of top view, looking vertically onto the device 1. The field electrode regions 15 are formed as vertical needles 25, arranged in a grid-like manner. The needles 25 are arranged consecutively in a first lateral direction 21, which is also visible in the sectional view of FIG. 1. Further, they are also arranged consecutively in a second lateral direction 22. The device 1 is divided into active cells 18 and diode cells 19, the former comprising source and body regions 2, 4. The diode junction 9 of the Schottky diode 7 is arranged in a diode cell 19 without any body/source implantations.

The diode cell 19 has a first width 29 in the first lateral direction 21, which is twice the width 28 of an active cell 18. In the second lateral direction 22, the diode cell 19 has a second width 39, which is equal to the width of an active cell 18 and to a distance 38 taken between two neighbouring vertical needles 25.

Figure 3A:
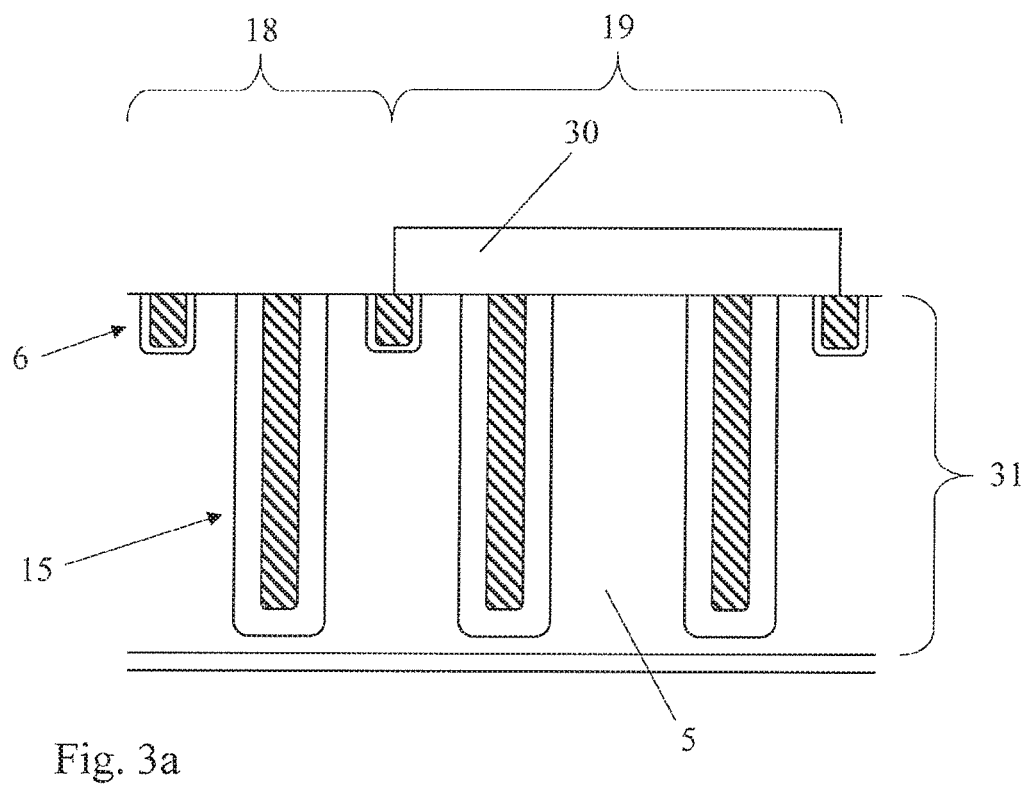
FIGS. 3a-3f illustrate the manufacturing of the transistor device of FIGS. 1 and 2 in different process steps.

In the process step shown in FIG. 3a, the gate regions 6 and the field electrode regions 15 have already been formed. In particular, the field electrode regions 15 and the gate regions 6 can be formed in different process steps, for instance the field electrode regions 15 prior to the gate regions 6.

For forming the field electrode regions 15, the location of the needles 25 can be defined by a photo mask. Then, the needle trenches can be etched, using for instance a hard mask. Thereafter, the trenches can be filled by the field oxide and the electrode material, e.g. polysilicon, followed by a planarization, for instance by chemical-mechanical polishing (CMP). Likewise, the locations of the gate regions 6 can be defined by photo lithography before etching the trenches. Then, the trenches are filled by the gate dielectric and the electrode material, for instance by the gate oxide and polysilicon. Subsequently, the device can be planarized by CMP.

Figure 3B:
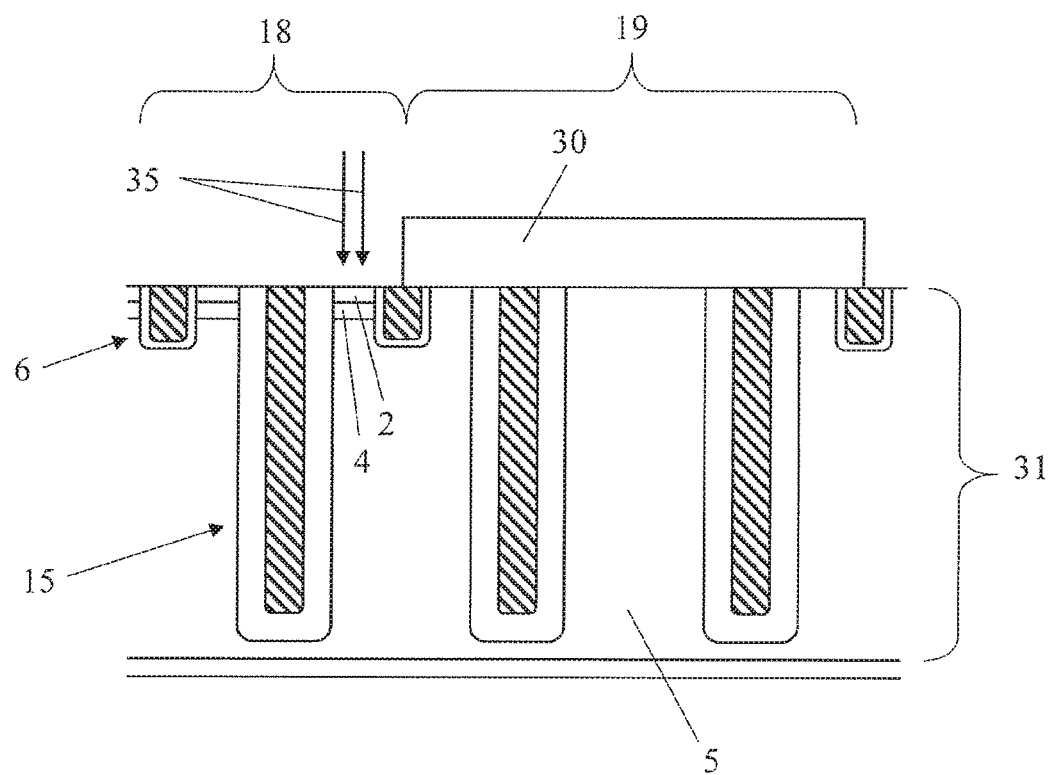

As can be seen in FIG. 3a, no gate region 6 is formed between the field electrode regions 15 in the diode cell 19. To protect the drift region layer 31 in the diode cell 19 during the body/source formation, a mask 30 is defined. It covers the drift region 5 in the diode cell 19. FIG. 3b illustrates the formation of the body region 4 and the source region 2 by implantations 35 in the active cell 18.

Figure 3C:
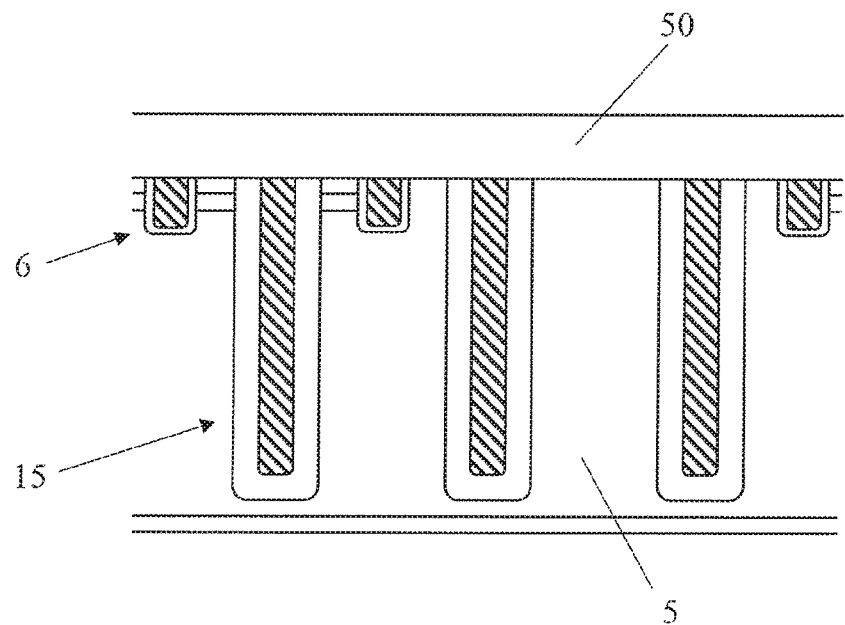
Figure 3D:
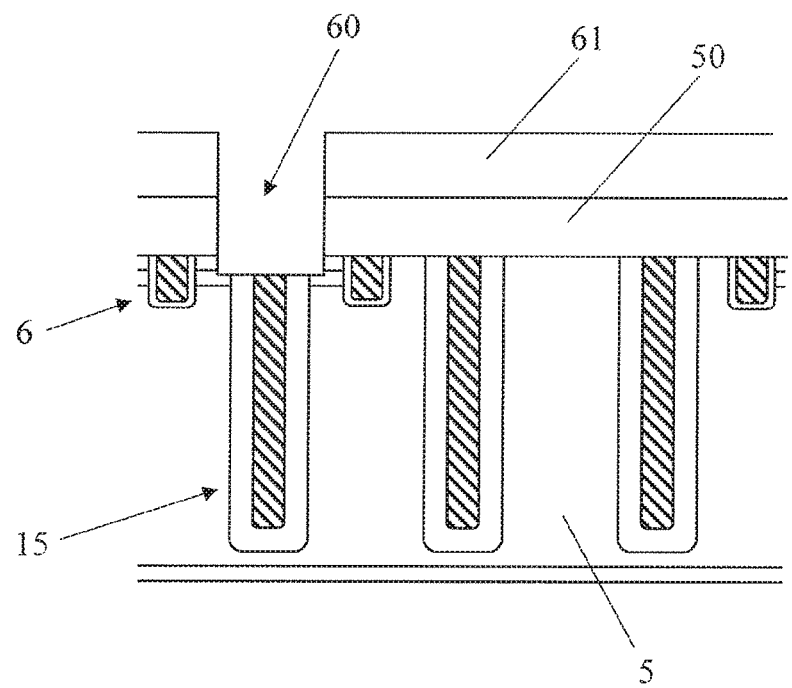

Subsequently, the mask 30 is removed and an interlayer dielectric 50 is deposited, see FIG. 3c. As shown in FIG. 3d, a first etch mask 61 is defined on the interlayer dielectric 50 to etch a source contact hole 60 down to the source/body regions 2, 4.

Figure 3E:
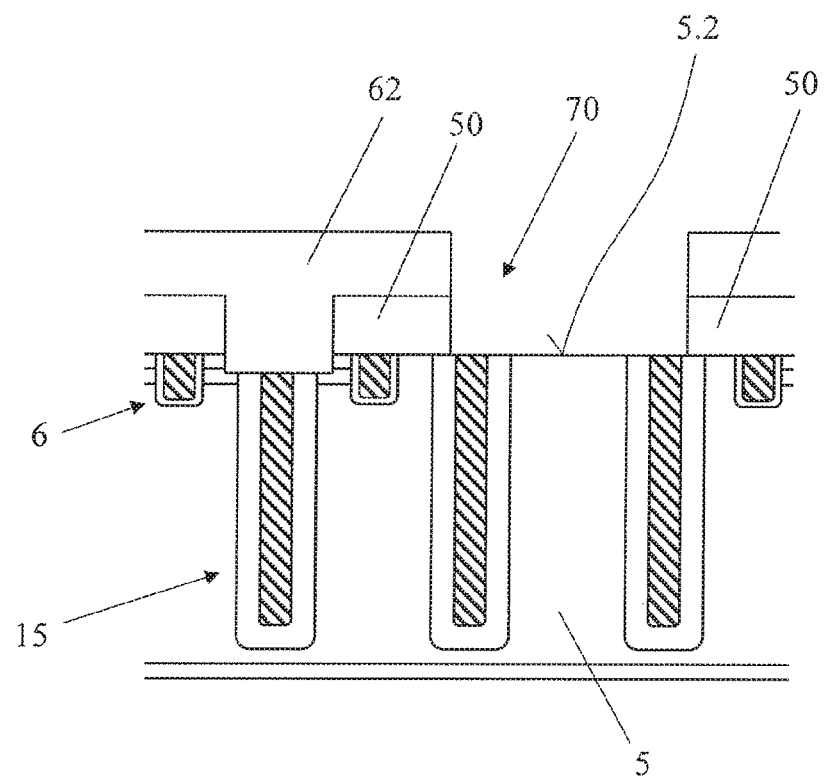
Figure 3F:
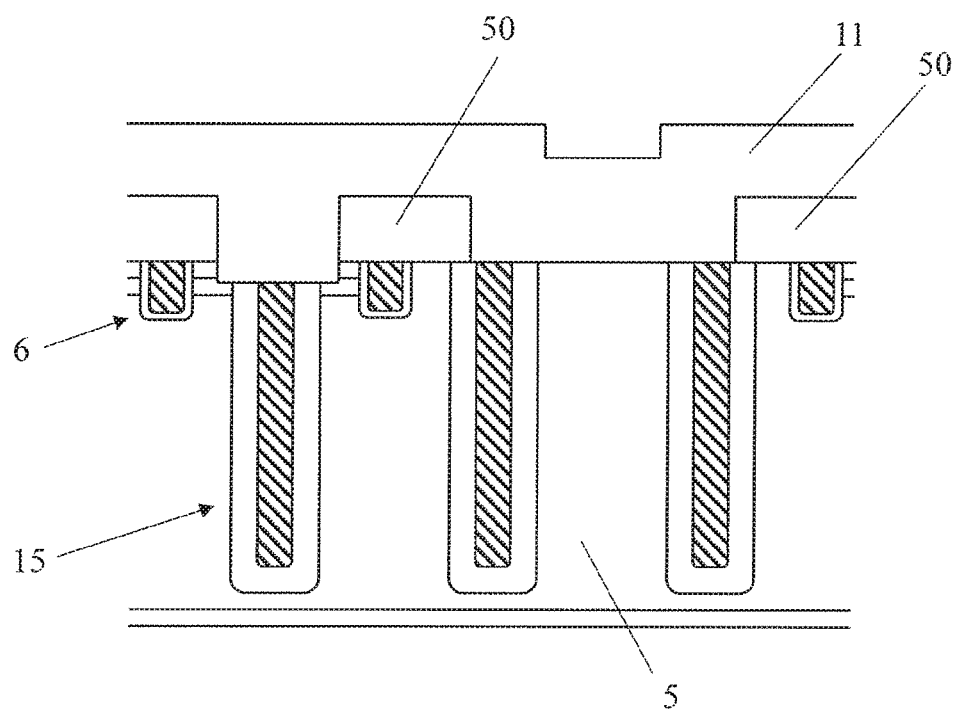

In a subsequent step shown in FIG. 3e, after a removal of the first etch mask 61, a second etch mask 62 is defined on the interlayer dielectric 50. It defines the Schottky contact in the diode cell 19, namely for etching a diode hole 70 through the interlayer dielectric 50 down to an upper surface 5.2 of the drift region 5. After a removal of the second etch mask 62, the front side metallization 11 can be deposited, see FIG. 3f.

Figure 4:
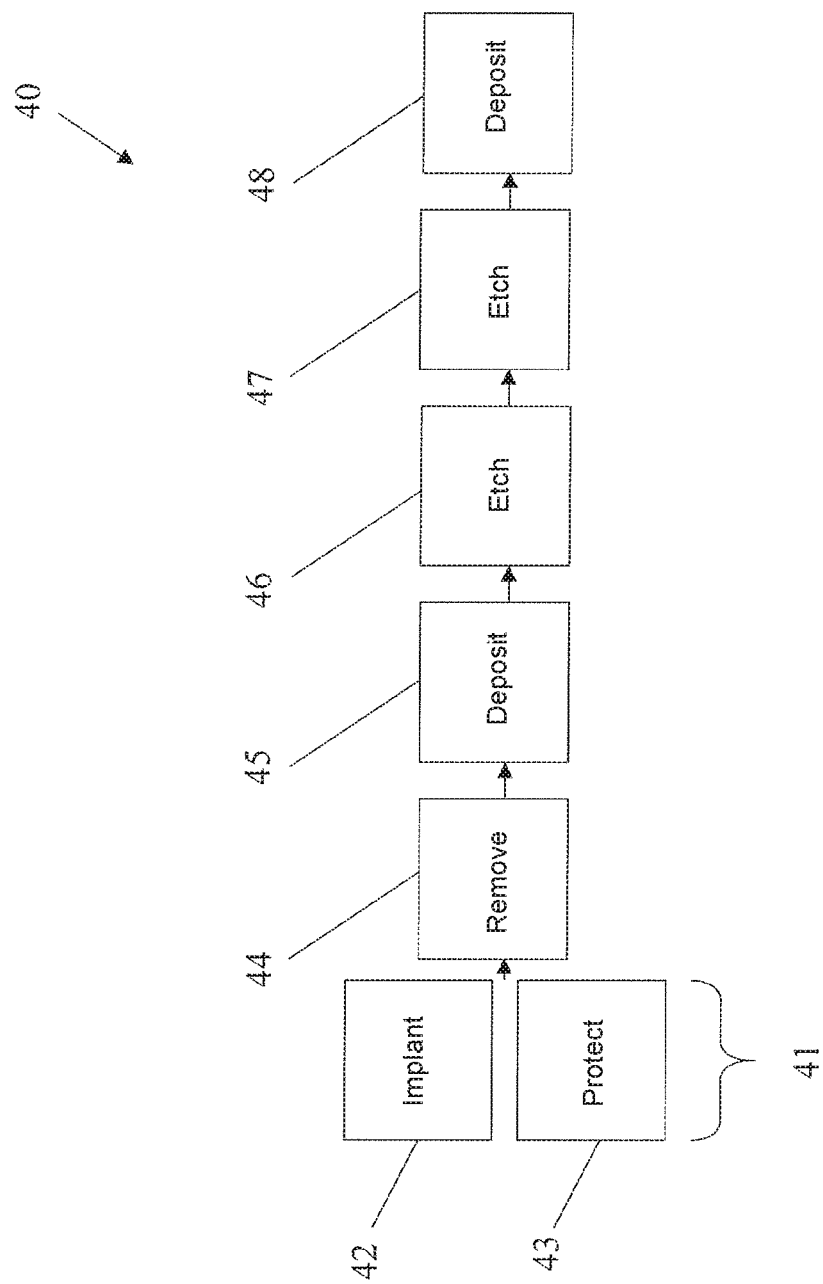
FIG. 4 illustrates the manufacturing of the transistor device in a block diagram.

In FIG. 4, process steps for forming 40 a Schottky junction are summarized in a flowchart. When the body and the source region 4, 2 are formed 41 by implanting 42 ions into the drift region substrate, the diode cell 19 is protected 43 by the mask 30. The mask is removed 44 thereafter, and the interlayer dielectric 50 is deposited 45. Through the interlayer dielectric 50, the source contact hole 60 is etched 46 by means of the first etch mask 61. Men, the diode hole 70 is etched 47 through the interlayer dielectric 50 by means of the second etch mask 62. By depositing 48 the front side metallization 11, the diode junction 9 of the Schottky diode 7 is formed.

Figure 5:
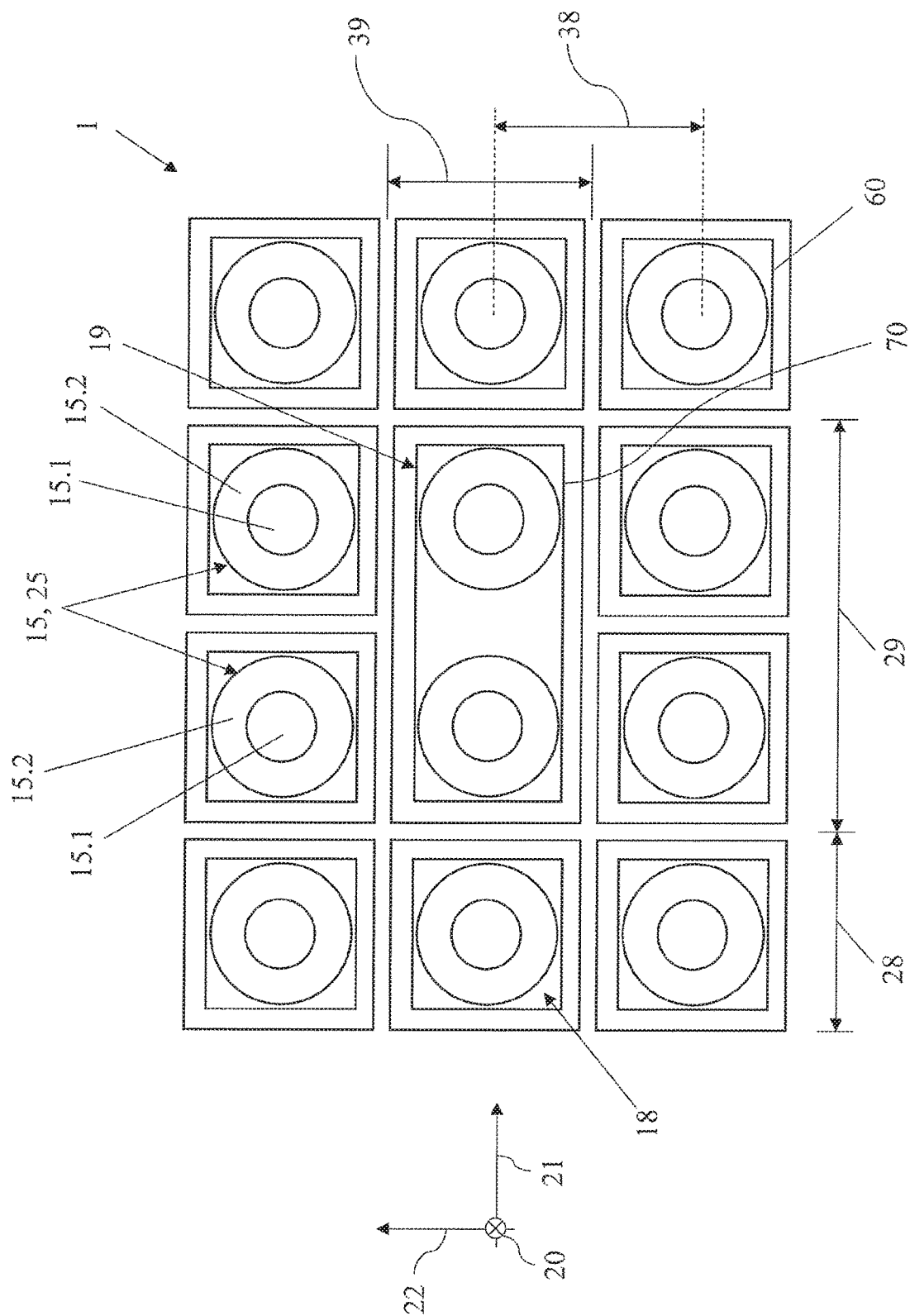
FIG. 5 illustrates an alternative diode cell design in a schematical top view.

FIG. 5 illustrates a transistor device 1 in a top view comparable to FIG. 2. The only difference between the devices 1 of FIGS. 2 and 3 is the size of the diode hole 70, which is larger in the embodiment of FIG. 5. Consequently, the diode junction 9 is larger in the embodiment of FIG. 5, wherein the active cells 18 remain unchanged, the source contact holes 60 have the same size as in FIG. 2. Having the diode junction 9 in a separate diode cell 19 can allow for an adaption of the size of the junction to application requirements without affecting the design of the active cells 18.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

LIST OF REFERENCE SIGNS transistor device 1
source region 2
   lower end 2a
   upper end 2b
drain region 3
body region 4
   channel 4.1
   upperend 4b
drift region 5
   drift zone 5.1
   upper surface 5.2
gate region 6
   gate electrode 6.1
   gate dielectric 6.2
Schottky diode 7
body diode 8
diode junction 9
front side metallization 11
field electrode regions 15
   field electrode 15.1
   field oxide 15.2
active cells 18
diode cell 19
vertical direction 20
first lateral direction 21
second lateral direction 22
needles (needle-shaped field electrode regions) 25
width 28
first width 29
mask 30
implantations 35
distance 38
second width 39
forming (a Schottky junction) 40
forming (body/source regions) 41
implanting (ions) 42
protecting (diode cell) 43
removing (mask) 44
depositing (interlayer dielectric) 45
etching (contact hole) 46
etching (diode hole) 47
depositing (front side metallization) 48
interlayer dielectric 50
source contact hole 60
first etch mask 61
second etch mask 62
diode hole 70

What is claimed is:

1. A semiconductor transistor device, comprising:
a source region;
a drain region;
a body region;
a drift region comprising a drift zone vertically between the body region and the drain region;
a gate region laterally aside the body region and configured to form a vertical channel in the body region; and
a Schottky diode electrically connected in parallel to a body diode formed between the body region and the drift region,
wherein a diode junction of the Schottky diode is formed adjacent to the drift region and is arranged vertically above a lower end of the body region,
wherein the source region and the body region are arranged in an active cell of the semiconductor transistor device,
wherein the diode junction of the Schottky diode is arranged in a diode cell of the semiconductor transistor device,
wherein the active cell and the diode cell lie one aside the other in a first lateral direction,
wherein an area of the diode junction of the Schottky diode has a share of at least 10% at an area of the diode cell.

2. The semiconductor transistor device of claim 1, wherein the diode junction of the Schottky diode is formed at an upper surface of the drift region, the upper surface lying in a horizontal plane.

3. The semiconductor transistor device of claim 1, wherein the diode junction of the Schottky diode has an area of at least 0.01 μm² and not more than 100 μm².

4. The semiconductor transistor device of claim 1, wherein the diode junction of the Schottky diode is arranged vertically above an upper end of the body region.

5. The semiconductor transistor device of claim 4, wherein the diode junction of the Schottky diode is arranged on a same vertical level as an upper end of the source region.

6. The semiconductor transistor device of claim 1, further comprising field electrode regions which respectively extend vertically into the drift region and are arranged consecutively in a first lateral direction, and wherein the diode junction of the Schottky diode extends in the first lateral direction over a whole distance between two neighboring ones of the field electrode regions.

7. The semiconductor transistor device of claim 6, wherein the field electrode regions are respectively formed as a vertical needle in a vertical needle trench, and wherein the vertical needles are arranged consecutively in the first lateral direction and also in a second lateral direction.

8. The semiconductor transistor device of claim 1, wherein the diode cell is devoid of implantations which are implanted into the source region and the body region.

9. The semiconductor transistor device of claim 1, wherein a first width of the diode cell taken in the first lateral direction is at least twice a width of the active cell taken in the first lateral direction.

10. The semiconductor transistor device of claim 1, further comprising field electrode regions which respectively extend vertically into the drift region and are arranged consecutively in the first lateral direction, wherein the diode junction of the Schottky diode extends in the first lateral direction over a whole distance between two neighboring ones of the field electrode regions, wherein the field electrode regions are respectively formed as a vertical needle in a vertical needle trench, wherein the vertical needles are arranged consecutively in the first lateral direction and also in a second lateral direction, and wherein a width of the diode cell taken in the second lateral direction is not more than four times a distance taken in the second lateral direction between two neighboring vertical needles.

11. A semiconductor transistor device, comprising:
a source region;
a drain region;
a body region;
a drift region comprising a drift zone vertically between the body region and the drain region;
a gate region laterally aside the body region and configured to form a vertical channel in the body region;
a Schottky diode electrically connected in parallel to a body diode formed between the body region and the drift region, a diode junction of the Schottky diode being formed adjacent to the drift region and is arranged vertically above a lower end of the body region; and
field electrode regions which respectively extend vertically into the drift region and are arranged consecutively in a first lateral direction,
wherein the diode junction of the Schottky diode extends in the first lateral direction over a whole distance between two neighboring ones of the field electrode regions,
wherein the field electrode regions are respectively formed as a vertical needle in a vertical needle trench, and wherein the vertical needles are arranged consecutively in the first lateral direction and also in a second lateral direction,
wherein the diode junction of the Schottky diode is arranged in a diode cell of the semiconductor transistor device,
wherein an area of the diode junction of the Schottky diode has a share of at least 10% at an area of the diode cell.

12. The semiconductor transistor device of claim 11, wherein the diode junction of the Schottky diode is arranged in a diode cell of the semiconductor transistor device, and wherein a width of the diode cell taken in the second lateral direction is not more than four times a distance taken in the second lateral direction between two neighboring vertical needles.

13. The semiconductor transistor device of claim 11, wherein the source region and the body region are arranged in an active cell of the semiconductor transistor device, wherein the diode junction of the Schottky diode is arranged in a diode cell of the semiconductor transistor device, and wherein the active cell and the diode cell lie one aside the other in a first lateral direction.

14. The semiconductor transistor device of claim 13, wherein the diode cell is devoid of implantations which are implanted into the source region and the body region.

* * * * *